(12) United States Patent
Wu et al.

(10) Patent No.: US 7,049,638 B2
(45) Date of Patent: May 23, 2006

(54) HIGH-BRIGHTNESS GALLIUM-NITRIDE BASED LIGHT EMITTING DIODE STRUCTURE

(75) Inventors: Liang-Wen Wu, Banciao (TW);
Ru-Chin Tu, Tainan (TW);
Cheng-Tsang Yu, Taichung (TW);
Tzu-Chi Wen, Tainan (TW); Fen-Ren Chien, Yonghe (TW)

(73) Assignee: Formosa Epitaxy Incorporation, Taoyuan (TW)

( * ) Notice: Subject to any disclaimer, the term of this patent is extended or adjusted under 35 U.S.C. 154(b) by 0 days.

(21) Appl. No.: 11/029,584

(22) Filed: Jan. 5, 2005

(65) Prior Publication Data
US 2006/0086942 A1   Apr. 27, 2006

(30) Foreign Application Priority Data
Oct. 21, 2004   (TW) .............................. 93131986 A

(51) Int. Cl.
*H01L 29/225* (2006.01)
(52) U.S. Cl. ..................................................... 257/97
(58) Field of Classification Search .................. 257/13, 257/97
See application file for complete search history.

(56) References Cited

U.S. PATENT DOCUMENTS

| | | | | |
|---|---|---|---|---|
| 5,751,013 | A * | 5/1998 | Kidoguchi et al. ............ 257/13 |
| 6,291,839 | B1 * | 9/2001 | Lester ........................... 257/91 |
| 6,337,493 | B1 * | 1/2002 | Tanizawa et al. .............. 257/79 |
| 6,420,733 | B1 * | 7/2002 | Koide et al. ................... 257/79 |
| 6,657,234 | B1 * | 12/2003 | Tanizawa ....................... 257/79 |
| 6,900,473 | B1 * | 5/2005 | Yoshitake et al. ............. 257/95 |
| 2001/0013605 | A1 * | 8/2001 | Umezaki et al. .............. 257/13 |
| 2002/0008243 | A1 * | 1/2002 | Goetz et al. ................... 257/79 |
| 2003/0132442 | A1 * | 7/2003 | Chang et al. .................. 257/79 |

* cited by examiner

*Primary Examiner*—Nathan J. Flynn
*Assistant Examiner*—Benjamin P. Sandvik

(57) ABSTRACT

A GaN-based LED structure is provided so that the brightness and luminous efficiency of the GaN-based LED are enhanced effectively. The greatest difference between the GaN-based LEDs according to the invention and the prior arts lies in the addition of a masking buffer layer on top of the p-type contact layer and a p-type roughened contact layer on top of the masking buffer layer. The masking buffer layer could be formed using MOCVD to deposit $Si_xN_y$ ($x,y \geq 1$), $Mg_wN_z$ ($w,z \geq 1$), or $Al_sIn_tGa_{1-s-t}N$ ($0 \leq s,t<1$, $s+t \leq 1$) heavily doped with Si and/or Mg. The masking buffer layer is actually a mask containing multiple randomly distributed clusters. Then, on top of the masking buffer layer, a p-type roughened contact layer made of p-type $Al_uIn Ga_{1-u-v}N$ ($0 \leq u,v<1$, $u+v \leq 1$) is developed. The p-type roughened contact layer does not grow directly on top of the masking buffer layer. Instead, the p-type roughened contact layer starts from the top surface of the underlying p-type contact layer not covered by the masking buffer layer's clusters. The p-type roughened contact layer then grows upward until it passes (but does not cover) the mask of the masking buffer layer for a specific distance. The total internal reflection that could have been resulted from the GaN-based LEDs' higher index of refraction than that of the atmosphere could be avoided. The GaN-based LEDs according to the present invention therefore have superior external quantum efficiency and luminous efficiency.

8 Claims, 3 Drawing Sheets

HIGH-BRIGHTNESS GALLIUM-NITRIDE BASED LIGHT EMITTING DIODE STRUCTURE

BACKGROUND OF THE INVENTION

1. Field of the Invention

The present invention generally relates to gallium-nitride based light emitting diodes and, more particularly, to the high-brightness gallium-nitride based light emitting diodes having roughened surfaces.

2. The Prior Arts

Gallium-nitride (GaN) based light-emitting diodes (LEDs), as various colored LEDs can be developed by controlling the GaN-based material's composition, has been the research and development focus in the academic arena and in the industries as well in recent years. One of the research directions regarding GaN-based LEDs lies in the further understanding of the luminous characteristics of GaN-based LEDs. Based on this knowledge, then, methods for enhancing GaN-based LEDs' luminous efficiency and brightness can be developed and discovered. These high-efficiency and high-brightness GaN-based LEDs would soon find their widespread application in outdoor display panels and automobile lamps.

The luminous efficiency of a GaN-based LED is mainly determined by the GaN-based LED's internal quantum efficiency and external quantum efficiency. The former relates to the probability of recombination of electrons and holes, thereby causing photons to be released, within the GaN-based LED's active layer. The more easily the electrons and holes are recombined, the more photons are released, and the higher the luminous efficiency of the GaN-based LED will be. The latter, on the other hand, relates to the probability of photons' successfully escape from the GaN-based LED without being absorbed or trapped inside. The more photons escape from the GaN-based LED, the higher the external quantum efficiency is, and the higher the luminous efficiency of the GaN-based LED will be.

The GaN-based LED's external quantum efficiency is also related to its index of refraction. Generally, the index of refraction of GaN-based LEDs is 2.5, higher than that of the atmosphere (whose index of refraction is 1). As such, total internal reflection would occur and photons released from the active layer would be reflected back to the GaN-based LEDs, significantly reducing the external quantum efficiency.

SUMMARY OF THE INVENTION

Therefore, the present invention provides an epitaxial structure for the GaN-based LEDs so that the limitations and disadvantages from the prior arts can be obviated practically.

The greatest difference between the GaN-based LEDs according to the present invention and the prior arts lies in the addition of a masking buffer layer on top of the p-type contact layer and a p-type roughened contact layer on top of the masking buffer layer within the traditional structure. The masking buffer layer could be formed using Metal Organic Chemical Vapor Deposition (MOCVD) to deposit silicon-nitride ($Si_xN_y$, $x,y \geq 1$), magnum-nitride ($Mg_wN_z$, $w,z \geq 1$), or aluminum-indium-gallium nitride ($Al_sIn_tGa_{1-s-t}N$, $0 \leq s,t<1$, $s+t \leq 1$) heavily doped with Si and Mg. The masking buffer layer is actually a mask containing multiple randomly distributed clusters of $Si_xN_y$, $Mg_wN_z$, or $Al_sIn_tGa_{1-s-t}N$. Then, on top of the masking buffer layer, a p-type roughened contact layer made of p-type $Al_uIn_vGa_{1-u-v}N$ ($0 \leq u,v<1$, $u+v \leq 1$) is developed. The p-type roughened contact layer does not grow directly on top of the masking buffer layer. Instead, the p-type roughened contact layer starts from the top surface of the underlying p-type contact layer not covered by the masking buffer layer's $Si_xN_y$, $Mg_wN_z$, or $Al_sIn_tGa_{1-s-t}N$ clusters. The p-type roughened contact layer then grows upward until it passes (but does not cover) the mask of the masking buffer layer for a specific distance.

In the present invention, due to that the masking buffer layer is developed first, the surfaces of the GaN-basd LEDs would therefore be roughened. This design avoids the total internal reflection that could have been resulted from the GaN-based LEDs' higher index of refraction than that of the atmosphere, which in turn would improve the external quantum efficiency and luminous efficiency of the GaN-based LEDs.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

The accompanied drawings are provided to illustrate the various embodiments of the present invention as described in this specification, so as to achieve better understanding of the major objectives of the present invention.

DETAILED DESCRIPTION OF THE PREFERRED EMBODIMENTS

In the following, detailed description along with the accompanied drawings is given to better explain preferred embodiments of the present invention. Please be noted that, in the accompanied drawings, some parts are not drawn to scale or are somewhat exaggerated, so that people skilled in the art can better understand the principles of the present invention.

Figure 1:
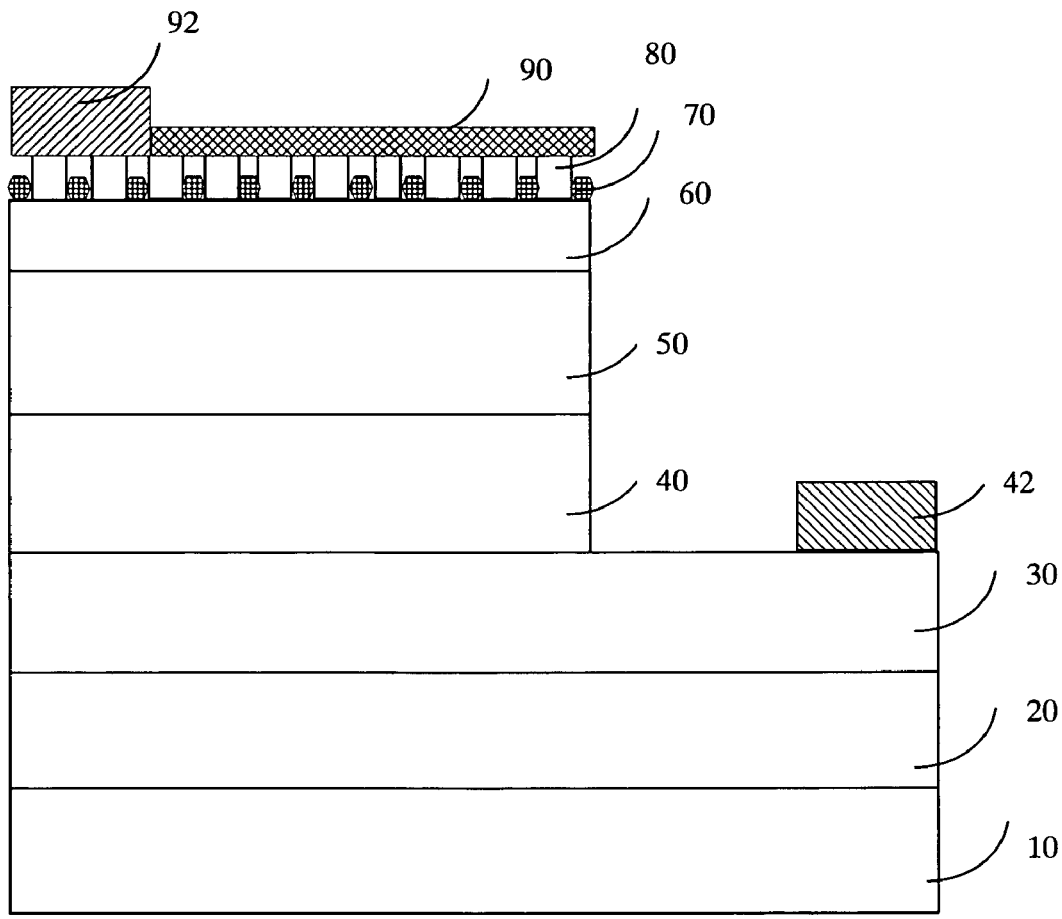
FIG. 1 is a schematic diagram showing the epitaxial structure of the high-brightness GaN-based LEDs according to the first embodiment of the present invention.

FIG. 1 is a schematic diagram showing the epitaxial structure of the GaN-based LEDs according to the first embodiment of the present invention. As shown in FIG. 1, the GaN-based LED has a substrate 10 made of C-plane, R-plane, or A-plane aluminum-oxide monocrystalline (sapphire), or an oxide monocrystalline having a lattice constant compatible with that of nitride semiconductors. The substrate 10 can also be made of SiC (6H—SiC or 4H—SiC), Si, ZnO, GaAs, or $MgAl_2O_4$. Generally, the most common material used for the substrate 10 is sapphire or SiC. A buffer layer 20 made of $Al_aGa_bIn_{1-a-b}N$ ($0 \leq a,b<1$, $a+b \leq 1$) having a specific composition is then formed on an upper side of the substrate 10. Then, an n-type contact layer 30 made of a GaN-based material is formed on the buffer layer 20. On top of the n-type contact layer 30, there are an active layer 40 made of indium-gallium-nitride (InGaN) and a negative electrode 42, not overlapping with each other.

The present embodiment then forms a p-type cladding layer 50 made of a p-type GaN-based material on top of the active layer 40. In turn, on top of the p-type cladding layer 50, there is a p-type contact layer 60 made of p-type GaN. Again, on top of the p-type contact layer 60, a masking buffer layer 70, which is a key element of the present invention, is formed. In the present embodiment, the masking buffer layer 70 is developed by MOCVD using $Si_cN_d$ (c,d≧1) having a specific composition up to a thickness between 5 Å and 100 Å under a growing temperature between 600° C. and 1100° C. The masking buffer layer 70 is actually a mask containing multiple randomly distributed $Si_cN_d$ clusters.

The present embodiment then develops a p-type roughened contact layer 80, which is another key element of the present invention, made of $Al_eIn_fGa_{1-e-f}N$, (0≦e,f<1, e+f≦1) having a specific composition up to a thickness between 500 Å and 10,000 Å under a growing temperature between 800° C. and 1100° C. The p-type roughened contact layer 80 does not grow directly on top of the masking buffer layer 70. Instead, the p-type roughened contact layer 80 starts from the top surface of the underlying p-type contact layer 60 not covered by the masking buffer layer 70's $Si_cN_d$ clusters. The p-type roughened contact layer 80 then grows upward until it passes (but does not cover) the mask of the masking buffer layer 70 for a specific distance.

Then, on top of the p-type roughened contact layer 80, there are a positive electrode 92 and a transparent conductive layer 90, which are not overlapping with each other. The positive electrode 92 is made of one of the materials including Ni/Au alloy, Ni/Pt alloy, Ni/Pd alloy, Ni/Co alloy, Pd/Au alloy, Pt/Au alloy, Ti/Au alloy, Cr/Au alloy, Sn/Au alloy, Ta/Au alloy, TiN, $TiWN_x$ (x≧0), $WSi_y$ (y≧0), and other similar metallic materials. The transparent conductive layer 90 could be a metallic conductive layer or a transparent oxide layer. The metallic conductive layer is made of one of the materials including Ni/Au alloy, Ni/Pt alloy, Ni/Pd alloy, Pd/Au alloy, Pt/Au alloy, Cr/Au alloy, Ni/Au/Be alloy, Ni/Cr/Au alloy, Ni/Pt/Au alloy, Ni/Pd/Au alloy, and other similar materials. The transparent oxide layer, on the other hand, is made of one of the materials including ITO, CTO, ZnO:Al, $ZnGa_2O_4$, $SnO_2$:Sb, $Ga_2O_3$:Sn, $AgInO_2$:Sn, $In_2O_3$:Zn, $CuAlO_2$, LaCuOS, NiO, $CuGaO_2$, and $SrCu_2O_2$.

Figure 2:
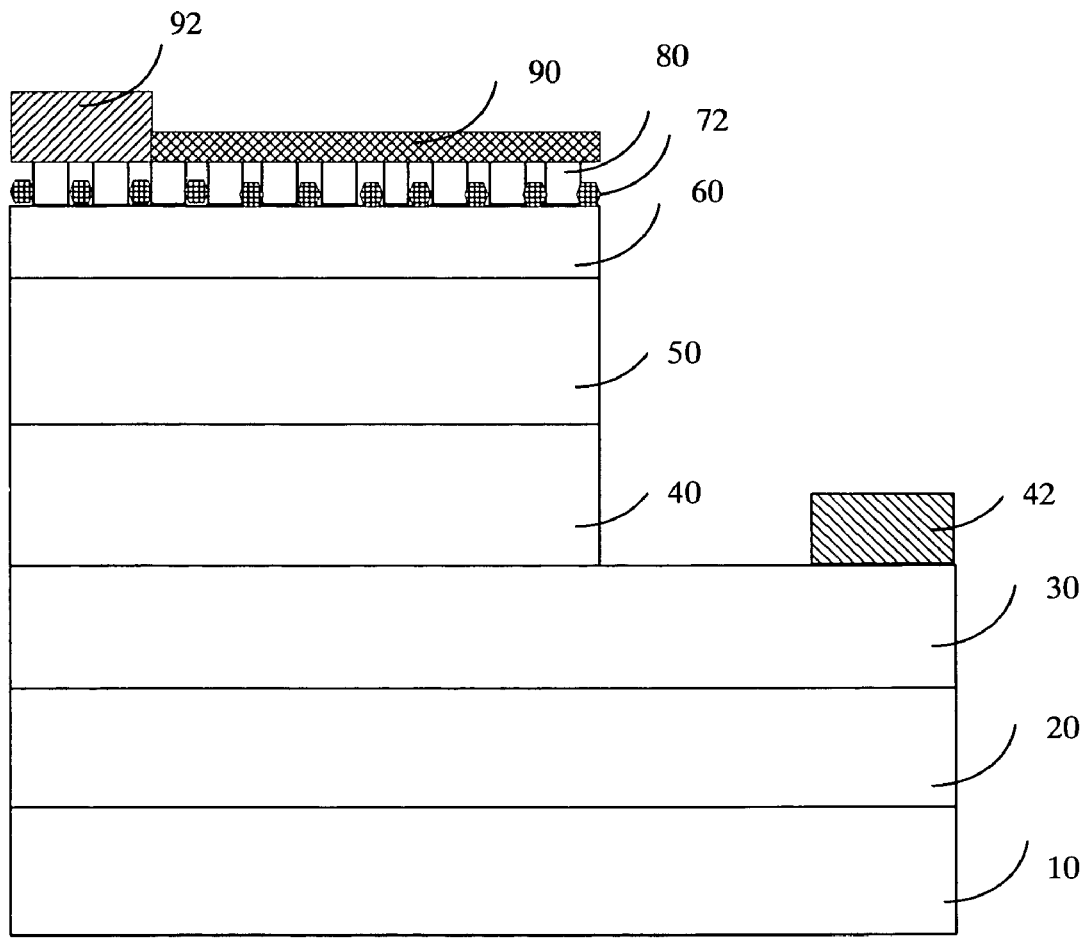
FIG. 2 is a schematic diagram showing the epitaxial structure of the GaN-based LEDs according to the second embodiment of the present invention.

FIG. 2 is a schematic diagram showing the epitaxial structure of the GaN-based LEDs according to the second embodiment of the present invention. As shown in FIG. 2, the present embodiment has an identical structure as in the previous embodiment. The only difference lies in the material used for the masking buffer layer. Within the present embodiment, the masking buffer layer 72 is developed also by MOCVD using $Mg_gN_h$ (g,h≧1) having a specific composition up to a thickness between 5 Å and 100 Å under a growing temperature between 600° C. and 1100° C. The masking buffer layer 72 is also a mask containing multiple randomly distributed $Mg_gN_h$ clusters.

The present embodiment then develops a p-type roughened contact layer 80 made of $Al_iIn_jGa_{1-i-j}N$, (0≦i,j<1, i+j≦1) having a specific composition up to a thickness between 500 Å and 10,000 Å under a growing temperature between 800° C. and 1100° C. The p-type roughened contact layer 80 does not grow directly on top of the masking buffer layer 72. Instead, the p-type roughened contact layer 80 starts from the top surface of the underlying p-type contact layer 60 not covered by the masking buffer layer 72's $Mg_gN_h$ clusters. The p-type roughened contact layer 80 then grows upward until it passes (but does not cover) the mask of the masking buffer layer 72 for a specific distance.

Figure 3:
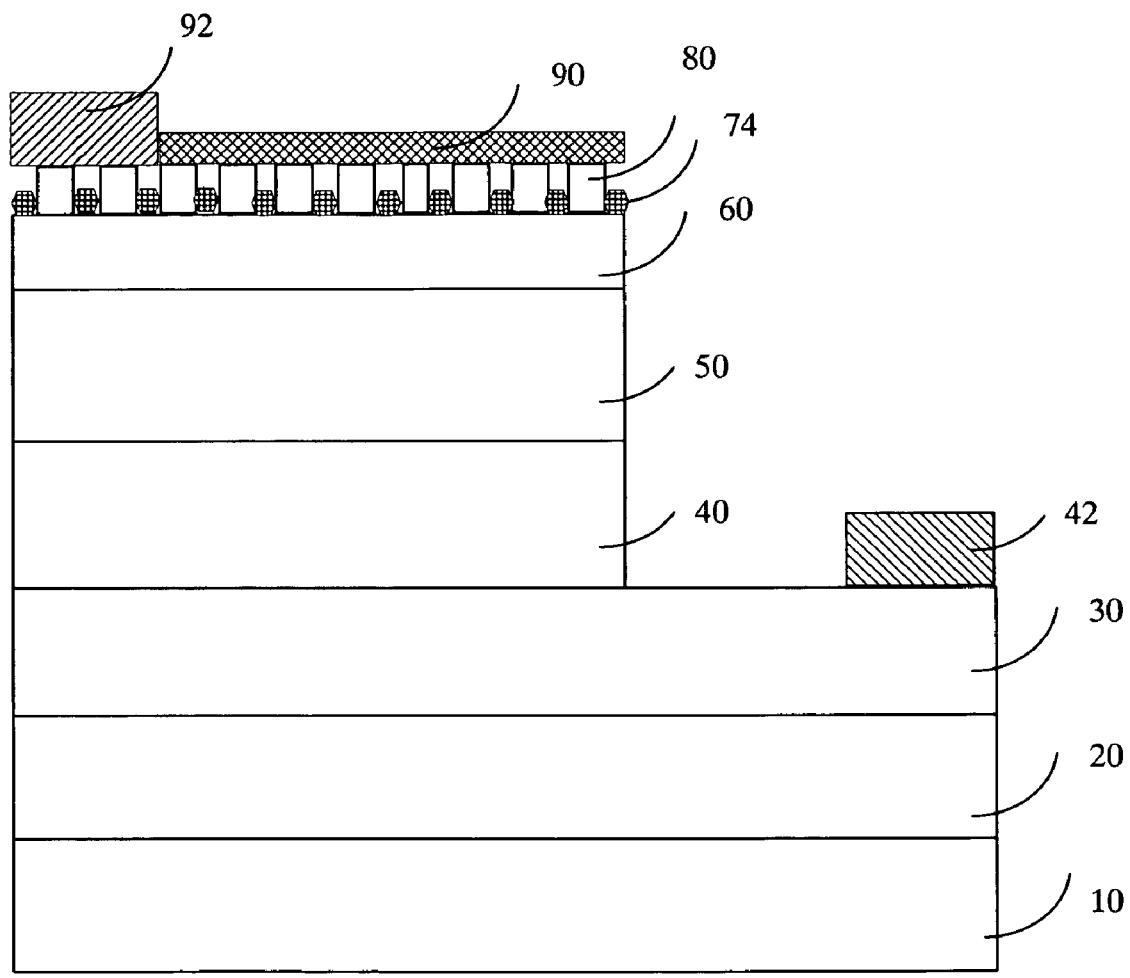
FIG. 3 is a schematic diagram showing the epitaxial structure of the GaN-based LEDs according to the third embodiment of the present invention.

FIG. 3 is a schematic diagram showing the epitaxial structure of the GaN-based LEDs according to the third embodiment of the present invention. As shown in FIG. 3, the present embodiment has an identical structure as in the previous embodiment. The only difference lies in the material used for the masking buffer layer. Within the present embodiment, the masking buffer layer 74 is developed also by MOCVD using heavily doped (>1×10$^{20}$ cm$^{-3}$) $Al_kIn_1Ga_{1-k-1}N$ (0≦k,1<1, k+1≦1) having a specific composition up to a thickness between 5 Å and 100 Å under a growing temperature between 600° C. and 1100° C. The dopant used could be Si, or Mg, or Si and Mg together. The masking buffer layer 72 is also a mask containing multiple randomly distributed $Al_kIn_1Ga_{1-k-1}N$ clusters.

The present embodiment then develops a p-type roughened contact layer 80 made of $Al_mIn_nGa_{1-m-n}N$, (0≦m,n<1, m+n≦1) having a specific composition up to a thickness between 500 Å and 10,000 Å under a growing temperature between 800° C. and 1100° C. The p-type roughened contact layer 80 does not grow directly on top of the masking buffer layer 74. Instead, the p-type roughened contact layer 80 starts from the top surface of the underlying p-type contact layer 60 not covered by the masking buffer layer 74's $Al_kIn_1Ga_{1-k-1}N$ clusters. The p-type roughened contact layer 80 then grows upward until it passes (but does not cover) the mask of the masking buffer layer 74 for a specific distance.

In aforementioned preferred embodiments of the present invention, the masking buffer layer and the p-type roughened contact layer jointly roughen the surfaces of the GaN-based LEDs. As such, the total internal reflection that could have been resulted from the GaN-based LEDs' higher index of refraction than that of the atmosphere could be avoided. The GaN-based LEDs according to the present invention therefore have superior external quantum efficiency and luminous efficiency.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A high-brightness GaN-based LED structure, comprising:

a substrate made of a material selected from the group consisting of sapphire, 6H—SiC, 4H—SiC, Si, ZnO, GaAs, $MgAl_2O_4$, and an oxide monocrystalline having a lattice constant compatible with those of nitride semiconductors;

a buffer layer made of $Al_aGa_bIn_{1-a-b}N$ (0≦a,b<1, a+b≦1) having a specific composition located on top of an upper side of said substrate;

an n-type contact layer made of a GaN-based material located on top of said buffer layer;

an active layer made of InGaN located on top a part of said n-type contact layer;

a negative electrode located on top of another part of said n-type contact layer not overlapping with said active layer;

a p-type cladding layer made of a p-type GaN-based material located on top of said active layer;

a p-type contact layer made of p-type GaN located on top of said p-type cladding layer;

a masking buffer layer made of a two-element nitride having a thickness between 5 Å and 100 Å located on top of said p-type contact layer, said masking buffer layer comprising a plurality of randomly distributed clusters made of said two-element nitride;

a p-type roughened contact layer made of $Al_eIn_fGa_{1-e-f}N$, ($0 \leq e, f < 1$, $e+f \leq 1$) having a specific composition, said p-type roughened contact layer growing upward from a top surface of said p-type contact layer not covered by said masking buffer layer's clusters until said p-type roughened contact layer passes without covering said masking buffer layer's mask and reaches a thickness between 500 Å and 10,000 Å;

a transparent conductive layer selected from the group consisting of a metallic conductive layer and a transparent oxide layer, located on top of a part of said p-type roughened contact layer's upper surface, said metallic conductive layer made of a material selected from the group consisting of Ni/Au alloy, Ni/Pt alloy, Ni/Pd alloy, Pd/Au alloy, Pt/Au alloy, Cr/Au alloy, Ni/Au/Be alloy, Ni/Cr/Au alloy, Ni/Pt/Au alloy, and Ni/Pd/Au alloy, and said transparent oxide layer made of a material selected from the group consisting of ITO, CTO, ZnO:Al, $ZnGa_2O_4$, $SnO_2$:Sb, $Ga_2O_3$:Sn, $AgInO_2$:Sn, $In_2O_3$:Zn, $CuAlO_2$, LaCuOS, NiO, $CuGaO_2$, and $SrCu_2O_2$; and a positive electrode located on top of another part of said p-type roughened contact layer's upper surface not covered by said transparent conductive layer, made of a material selected from the group consisting of Ni/Au alloy, Ni/Pt alloy, Ni/Pd alloy, Ni/Co alloy, Pd/Au alloy, Pt/Au alloy, Ti/Au alloy, Cr/Au alloy, Sn/Au alloy, Ta/Au alloy, TiN, $TiWN_x$ ($x \geq 0$), and $WSi_y$ ($y \geq 0$).

2. The high-brightness GaN-based LED structure as claimed in claim 1, wherein said two-element nitride is $Si_cN_d$ ($c, d \geq 1$) having a specific composition.

3. The high-brightness GaN-based LED structure as claimed in claim 1, wherein said two-element nitride is $Mg_gN_h$ ($g, h \geq 1$) having a specific composition.

4. A high-brightness GaN-based LED structure, comprising:

a substrate made of a material selected from the group consisting of sapphire, 6H—SiC, 4H—SiC, Si, ZnO, GaAs, $MgAl_2O_4$, and an oxide monocrystalline having a lattice constant compatible with those of nitride semiconductors;

a buffer layer made of $Al_aGa_bIn_{1-a-b}N$ ($0 \leq a, b < 1$, $a+b \leq 1$) having a specific composition located on top of an upper side of said substrate;

an n-type contact layer made of a GaN-based material located on top of said buffer layer;

an active layer made of InGaN located on top a part of said n-type contact layer;

a negative electrode located on top of another part of said n-type contact layer not overlapping with said active layer;

a p-type cladding layer made of a p-type GaN-based material located on top of said active layer;

a p-type contact layer made of p-type GaN located on top of said p-type cladding layer;

a masking buffer layer made of $Al_kIn_1Ga_{1-k-1}N$ ($0 \leq k, 1 < 1$, $k+1 \leq 1$) having a specific composition and having a thickness between 5 Å and 100 Å located on top of said p-type contact layer, said masking buffer layer doped up to a concentration by a dopant selected from group II and group IV elements, said masking buffer layer comprising a plurality of randomly distributed clusters made of $Al_kIn_1Ga_{1-k-1}N$;

a p-type roughened contact layer made of $Al_eIn_fGa_{1-e-f}N$, ($0 \leq e, f < 1$, $e+f \leq 1$) having a specific composition, said p-type roughened contact layer growing upward from a top surface of said p-type contact layer not covered by said masking buffer layer's clusters until said p-type roughened contact layer passes without covering said masking buffer layer's mask and reaches a thickness between 500 Å and 10,000 Å;

a transparent conductive layer selected from the group consisting of a metallic conductive layer and a transparent oxide layer, located on top of a part of said p-type roughened contact layer's upper surface, said metallic conductive layer made of a material selected from the group consisting of Ni/Au alloy, Ni/Pt alloy, Ni/Pd alloy, Pd/Au alloy, Pt/Au alloy, Cr/Au alloy, Ni/Au/Be alloy, Ni/Cr/Au alloy, Ni/Pt/Au alloy, and Ni/Pd/Au alloy, and said transparent oxide layer made of a material selected from the group consisting of ITO, CTO, ZnO:Al, $ZnGa_2O_4$, $SnO_2$:Sb, $Ga_2O_3$:Sn, $AgInO_2$:Sn, $In_2O_3$:Zn, $CuAlO_2$, LaCuOS, NiO, $CuGaO_2$, and $SrCu_2O_2$; and a positive electrode located on top of another part of said p-type roughened contact layer's upper surface not covered by said transparent conductive layer, made of a material selected from the group consisting of Ni/Au alloy, Ni/Pt alloy, Ni/Pd alloy, Ni/Co alloy, Pd/Au alloy, Pt/Au alloy, Ti/Au alloy, Cr/Au alloy, Sn/Au alloy, Ta/Au alloy, TiN, $TIWN_x$ ($x \geq 0$), and $WSi_y$ ($y \geq 0$).

5. The high-brightness GaN-based LED structure as claimed in claim 4, wherein said dopant is Si.

6. The high-brightness GaN-based LED structure as claimed in claim 4, wherein said dopant is Mg.

7. The high-brightness GaN-based LED structure as claimed in claim 4, wherein said dopant is Si and Mg.

8. The high-brightness GaN-based LED structure as claimed in claim 4, wherein said concentration is greater than $1 \times 10^{20}$ cm$^{-3}$.

* * * * *